United States Patent
Prinslow et al.

(10) Patent No.: US 6,380,609 B1
(45) Date of Patent: Apr. 30, 2002

(54) SILICIDED UNDOPED POLYSILICON FOR CAPACITOR BOTTOM PLATE

(75) Inventors: Douglas A. Prinslow, McKinney; F. Scott Johnson, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/661,717

(22) Filed: Sep. 14, 2000

Related U.S. Application Data

(60) Provisional application No. 60/162,175, filed on Oct. 28, 1999.

(51) Int. Cl.[7] .................................................. H01L 29/00
(52) U.S. Cl. ......................... 257/532; 438/393; 438/396
(58) Field of Search ............................... 257/370, 306, 257/532, 379; 438/202, 203, 210, 234, 250, 324, 329, 393, 396

(56) References Cited

U.S. PATENT DOCUMENTS

| | | | | |
|---|---|---|---|---|
| 5,130,267 A | * | 7/1992 | Kaya et al. ................. 438/453 |
| 5,736,776 A | * | 4/1998 | Yamamoto et al. .......... 257/532 |
| 6,090,656 A | * | 7/2000 | Randazzo .................... 438/239 |
| 6,117,755 A | * | 9/2000 | Kun-Yu et al. .............. 438/592 |
| 6,143,618 A | | 11/2000 | Chen et al. .................. 438/396 |
| 6,211,556 B1 | * | 4/2001 | Wu .............................. 257/382 |
| 6,218,240 B1 | * | 4/2001 | Pang ........................... 438/253 |
| 6,235,574 B1 | * | 5/2001 | Tobben et al. .............. 438/241 |
| 6,242,300 B1 | * | 6/2001 | Wang .......................... 438/241 |

FOREIGN PATENT DOCUMENTS

JP       7-240500    *   9/1995  ........... H01L/27/04

* cited by examiner

*Primary Examiner*—Carl Whitehead, Jr.
*Assistant Examiner*—Toniae M. Thomas
(74) *Attorney, Agent, or Firm*—Jacqueline J. Garner; W. James Brady, III; Frederick J. Telecky, Jr.

(57) ABSTRACT

A capacitor (110) having a bottom plate (104) that comprises undoped polysilicon (106) which has been silicided (108). An advantage of the invention is providing a capacitor (110) having reduced parasitic capacitance to the substrate (100) and reduced sheet resistance of the bottom plate (104).

12 Claims, 3 Drawing Sheets

SILICIDED UNDOPED POLYSILICON FOR CAPACITOR BOTTOM PLATE

This application claims priority under 35 USC §119(e)(1) of provisional application No. 60/162,175 filed Oct. 28, 1999.

FIELD OF THE INVENTION

The invention is generally related to the field of forming capacitors on a semiconductor device and more specifically to forming large area capacitors on high speed RF devices.

BACKGROUND OF THE INVENTION

High performance capacitors are needed for RF circuits such as ac coupling capacitors in mixers and LNAs, ADCs (analog to digital converters), DAC (digital to analog converters), and filters. High intended capacitance per square micron, low resistances, and high intended capacitance/parasitic capacitance ratio are critical. Several types of capacitors are known in the art. FIG. 1A shows a poly/diffusion capacitor in which the capacitor is formed using a polysilicon layer 16 separated from a doped region 12 by a gate oxide layer 14. FIG. 1B shows a poly/poly capacitor in which a first doped polysilicon layer 20 is formed on a field oxide region 18 and separated from a second doped polysilicon layer 24 by an oxide layer 22. A third capacitor type is shown in FIG. 1C. It is a metal/metal capacitor in which two metal layers 30,34 are separated by a thicker oxide layer 32. Metal/metal capacitors have lower intended capacitance per square micron and thus require a larger area.

Two newer capacitors are shown in FIGS. 1D&1E. These capacitors use a bottom plate comprising a layer of doped polysilicon 40 with an overlying layer of titanium-silicide 42. The top plate 46 is titanium-nitride. The capacitor dielectric 44 is an oxide. In one variation, the bottom plate polysilicon 40 is separated from a underlying layer of doped polysilicon 48 by a thicker oxide layer 50. However, further decreases in the parasitic capacitance to substrate and sheet resistance is desired.

SUMMARY OF THE INVENTION

The invention is a capacitor having a bottom plate that comprises undoped polysilicon which has been silicided. An advantage of the invention is providing a capacitor having reduced parasitic capacitance to the substrate and reduced sheet resistance of the bottom plate.

These and other advantages will be apparent to those of ordinary skill in the art having reference to the specification in conjunction with the drawings.

DETAILED DESCRIPTION OF THE EMBODIMENTS

A capacitor according to the invention may be incorporated in a BiCMOS integrated circuit. For example, the invention may be used as an ac coupling capacitor in a low noise amplifier. Other integrated circuits in which the invention may be incorporated, such as mixers, filters, ADCs, or DACs, will be apparent to those of ordinary skill in the art. The capacitor according to the invention has a reduced parasitic capacitance to ground and is therefore especially applicable to integrated circuits requiring a high operating frequency (e.g., RF BiCMOS circuits).

Figure 1A:
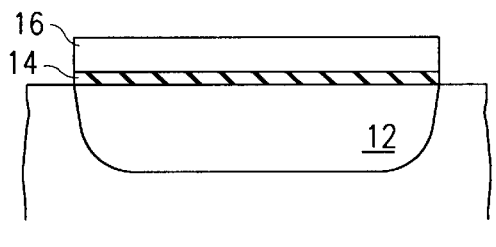
FIGS. 1A–1E are cross-sectional diagrams of prior art capacitors.
Figure 1D:
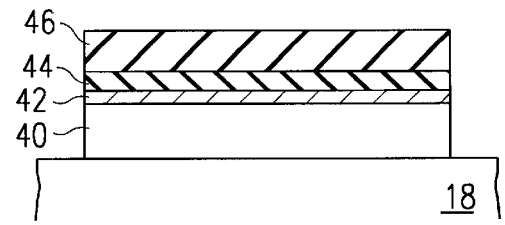
Figure 1B:
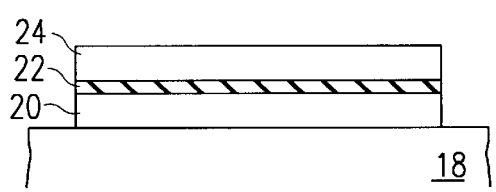
Figure 1E:
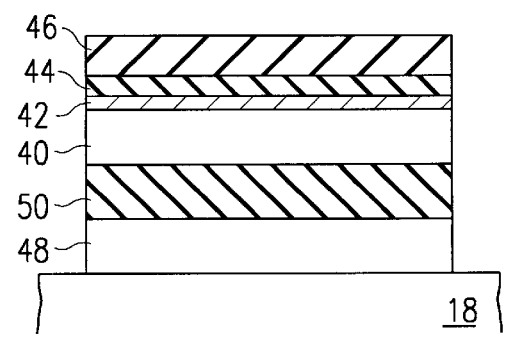
Figure 1C:
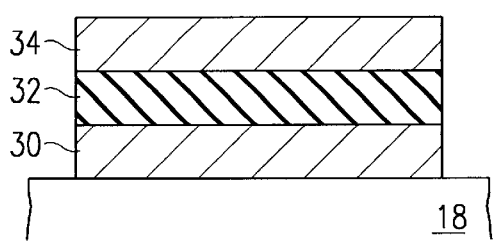
Figure 2:
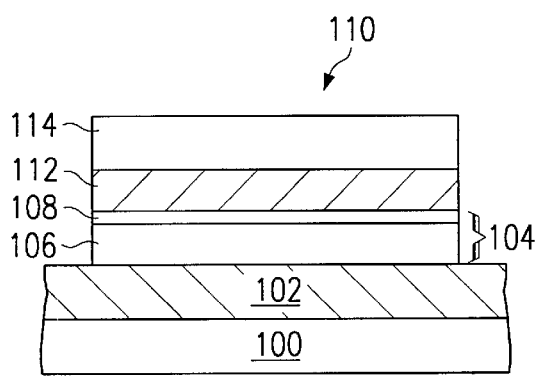
FIG. 2 is a cross-sectional diagram of a capacitor according to a first embodiment of the invention.

FIG. 2 shows a capacitor 110 according to a first embodiment of the invention formed over a substrate 100. Substrate 100 may, for example, be comprise silicon and may include one or more epitaxial layers formed thereon as is known in the art. Substrate 100 may also include devices (not shown) formed therein such as CMOS and/or bipolar transistors. Capacitor 110 is located on a thick oxide layer 102 such as a field oxide. Typically, thick oxide layer 102 is on the order of 5000 Å, but may be as thin as approximately 2000 Å.

The bottom plate 104 of capacitor 110 is located on the thick oxide layer 102 and includes a polysilicon layer 106 and a silicide layer 108. Polysilicon layer 106 is undoped polysilicon and has a thickness on the order of 3200 Å. Because bottom plate 104 includes a silicide layer 108, reduced resistance in the polysilicon layer 106 from doping is not required. Moreover, silicide sheet resistance has been shown to be less when the silicide is formed over undoped polysilicon than when silicide is formed over heavily doped silicon. As a result, not doping the polysilicon layer 106 actually decreases the sheet resistance of the bottom plate 104.

Another advantage of not doping polysilicon layer 106 is decreased parasitic capacitance. Intrinsic (undoped) polysilicon has a dielectric constant of 11.9 and silicon dioxide has a dielectric constant of 3.9. Therefore, 3200 Å of intrinsic polysilicon is equivalent to approximately 1000 Å of oxide as a dielectric. This results is a 20% decrease in parasitic capacitance and a higher Q.

Silicide layer 108 may comprise titanium silicide. However, other silicides such as cobalt-silicide may alternatively be used.

A capacitor dielectric 112 separates the bottom plate 104 from the top plate 114 of the capacitor 110. In the preferred embodiment, capacitor dielectric 112 comprises silicon dioxide. However, other suitable capacitor dielectric, such as silicon-oxynitride, are known in the art. Capacitor dielectric 112 has a thickness on the order of 500 Å.

Top plate 114 is located on capacitor dielectric 112. Top plate 114 comprises a conductive metal. For example, titanium-nitride or tungsten may be used. For titanium nitride, the thickness of top plate 114 is on the order of 2000 Å.

The capacitor 110, according to the first embodiment of the invention, may be fabricated as part of a standard BiCMOS process flow. The only changes required are mask level changes. The mask levels used in doping the CMOS polysilicon gates are changed to block the implants from the area in which the capacitor 114 is to be formed.

Figure 3A:
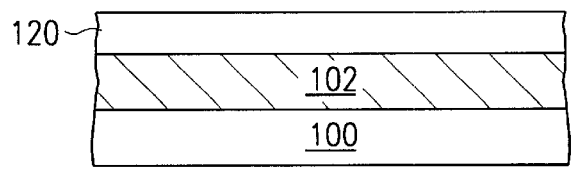
FIGS. 3A–3D are cross-sectional diagrams of the capacitor of FIG. 2 at various stages of fabrication.

Referring to FIG. 3A, the substrate 100 is processed through the deposition of the polysilicon gate layer 120 in a BiCMOS process. This includes the formation of any buried layers (e.g., the collector) and well regions (not shown). For example, a twin-well process known in the art may be used. It also includes the formation of field oxide 102. Field oxide 102 is used to define the active regions (not shown) of the substrate into which transistors are to be formed as is known in the art. Because polysilicon gate layer 120 is also used to form the CMOS gate electrodes and emitter electrodes, the thickness is determined by those functions. A typical thickness is on the order of 3200 Å.

Figure 3B:
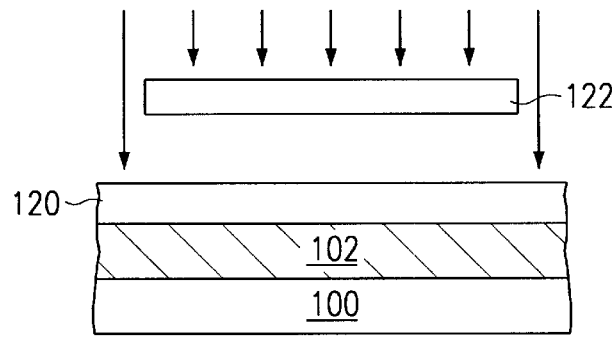

Referring to FIG. 3B, a first masking layer 122 is formed. First masking layer 122 is typically used to block the n-type dopant implant from the PMOS regions of the device. According to the invention, first masking layer 122 is also used to block the n-type dopant implant from the area 124 where capacitor 110 is to be formed. A second masking layer is thin used to block the p-type dopant implant from the NMOS regions, the second masking layer is also used to block the implant from the area 124 where the capacitor 110 is to be formed.

Figure 3C:
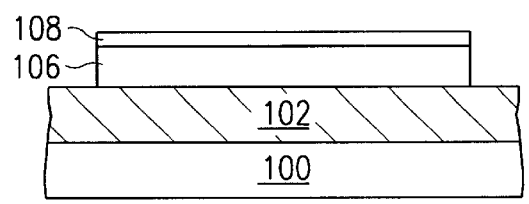

After implant, the polysilicon layer 120 is patterned and etched to form the polysilicon layer 106 of bottom plate 104 of the capacitor 110, as shown in FIG. 3C. The CMOS gate electrodes and emitter electrodes (not shown) are also formed at this time. Then, several additional implants are performed to form the CMOS source/drain and drain extension regions. The masking layers for these steps are all likewise used to block the implant from the bottom plate 104.

Still referring to FIG. 3C, a silicide layer 108 is formed over polysilicon layer 106. At the same time, the CMOS gate electrodes, emitter electrodes, and source/drain regions are typically silicided. As an example, silicide layer 108 may be formed by depositing a layer of titanium and reacting it with polysilicon layer 106, in a nitrogen containing ambient, to form titanium-silicide. Any remaining titanium or titanium-nitride are then removed.

Figure 3D:
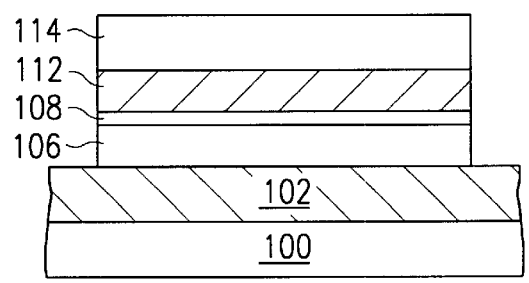

Capacitor dielectric 112 is then formed over bottom plate 104 as shown in FIG. 3D. Capacitor dielectric 112 may be formed by deposition of silicon dioxide. Other suitable capacitor dielectric, such as silicon-oxynitride, may alternatively be used. Capacitor dielectric 112 has a thickness on the order of 500 Å.

Finally, top plate 114 is formed over capacitor dielectric 112. Top plate 114 may have a thickness on the order of 2000 Å. Top plate 114 comprises a conductive metal such as TiN or tungsten.

Figure 4:
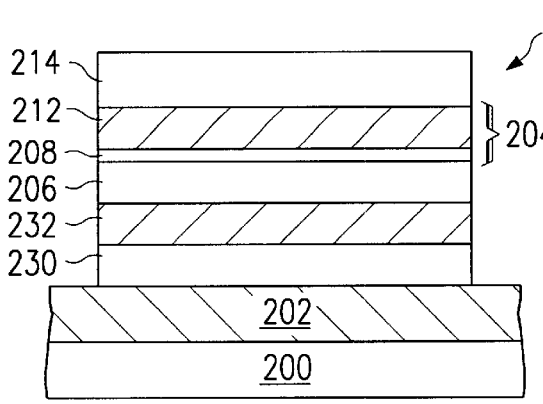
FIG. 4 is a capacitor according to a second embodiment of the invention.

A capacitor 210 according to a second embodiment of the invention is shown in FIG. 4. Substrate 200 may, for example, be comprise silicon and may include one or more epitaxial layers formed thereon as is known in the art. As in the first embodiment, substrate 200 may also include devices (not shown) formed therein such as CMOS and/or bipolar transistors. Capacitor 210 is located on a thick oxide layer 202 such as a field oxide. Typically, thick oxide layer 202 is on the order of 5000 Å, but may be as thin as approximately 2000 Å.

Overlying thick oxide 202 is a first polysilicon layer 230. It is undoped polysilicon and has a thickness on the order of 1300A. A dielectric layer 232 overlies undoped polysilicon layer 230. Dielectric layer 232 preferably comprises silicon dioxide and has a thickness on the order of 2000 Å.

The bottom plate 204 of capacitor 210 is located on the dielectric layer 232 and includes a second polysilicon layer 206 and a silicide layer 208. Second polysilicon layer 206 is also undoped polysilicon and has a thickness on the order of 1900 Å. Because bottom plate 204 includes a silicide layer 208, reduced resistance in the second polysilicon layer 206 from doping is not required. Moreover, silicide sheet resistance has been shown to be less when the silicide is formed over undoped polysilicon than when silicide is formed over heavily doped silicon. As a result, not doping the polysilicon layer 206 actually decreases the sheet resistance of the bottom plate 204.

Another advantage of not doping polysilicon layers 230 and 206 is decreased parasitic capacitance. Intrinsic (undoped) polysilicon has a dielectric constant of 11.9 and silicon dioxide has a dielectric constant of 3.9. Therefore, 3200 Å (the total thickness of the first and second polysilicon layers) of intrinsic polysilicon is equivalent to approximately 1000 Å of oxide as a dielectric. This results is a 20% decrease in parasitic capacitance and a higher Q.

As in the first embodiment, silicide layer 208 may comprise titanium silicide. However, other silicides such as cobalt-silicide may alternatively be used.

A capacitor dielectric 212 separates the bottom plate 204 from the top plate 214 of the capacitor 210. In the preferred embodiment, capacitor dielectric 212 comprises silicon dioxide. However, other suitable capacitor dielectric, such as silicon-oxynitride, are known in the art. Capacitor dielectric 212 has a thickness on the order of 500 Å.

Top plate 214 is located on capacitor dielectric 212. Top plate 214 comprises a conductive metal. For example, titanium-nitride or tungsten may be used. For titanium nitride, the thickness of top plate 214 is on the order of 2000 Å.

The capacitor 210, according to the second embodiment of the invention, may be fabricated as part of a split-level polysilicon BiCMOS process flow. The only changes required are mask level changes. The mask levels used in doping the CMOS polysilicon gates and source/drain regions are changed to block the implants from the area in which the capacitor 214 is to be formed.

Figure 5A:
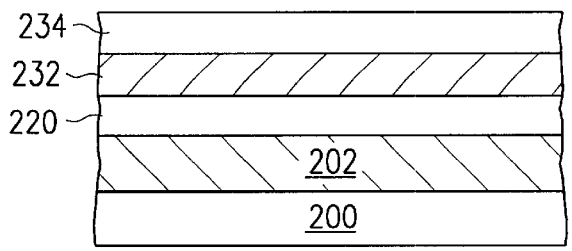
FIGS. 5A–5D are cross-sectional diagrams of the capacitor of FIG. 4 at various stages of fabrication.

Referring to FIG. 5A, the substrate 200 is processed through the deposition of the first polysilicon gate layer 220 in a split-poly BiCMOS process. This includes the formation of any buried layers (e.g., the collector) and well regions (not shown). For example, a twin-well process known in the art may be used. It also includes the formation of field oxide 202. Field oxide 202 is used to define the active regions (not shown) of the substrate into which transistors are to be formed as is known in the art. Because polysilicon gate layer 220 is also used to form part of the CMOS gate electrodes and emitter electrodes, the thickness is determined by those functions. A typical thickness is on the order of 1300 Å.

Dielectric layer 232 is then formed over polysilicon layer 220. Dielectric layer 232 is then patterned and etched to remove it from over the CMOS gate areas. A second polysilicon layer 234 is then deposited. Second polysilicon later 234 is used to complete the formation of the CMOS, gates. It also serves as part of the bottom plate 204. Second polysilicon layer 234 has a thickness on the order of 1900 Å. A split-poly process allows for the emitter electrodes and CMOS gates to be separately optimized. Only the first polysilicon layer is used for the emitter electrode and both polysilicon layers are used for the CMOS gates.

Figure 5B:
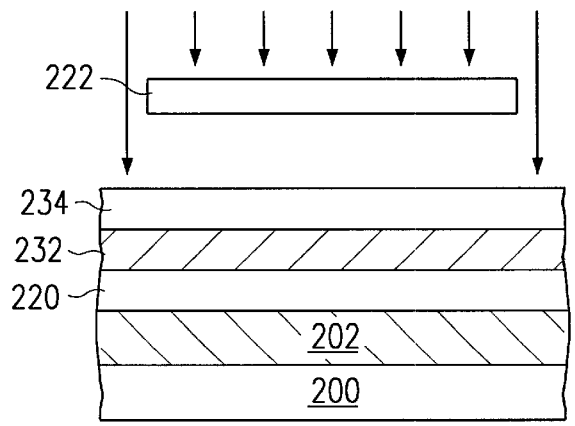

Polysilicon layers 220 and 234 are doped are various points in the process. For example, there is an masked emitter implant, masked NMOS implant and masked PMOS implant. All of the masking layers, represented collectively by masking layer 222 in FIG. 5B, used during these implants are also used to block the implants from the capacitor area 224.

Figure 5C:
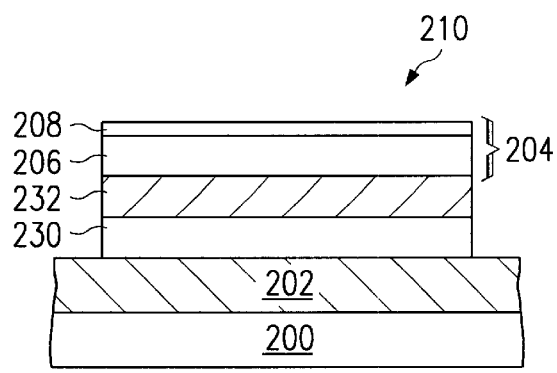

After the masked implants, the polysilicon layers 220 and 234 are patterned and etched to form the polysilicon layers 230 and 206 of bottom plate 204 of the capacitor 210, as shown in FIG. 5C. The CMOS gate electrodes (not shown) are also formed at this time. Then, several additional implants are performed to form the CMOS source/drain and drain extension regions. The masking layers for these steps are all likewise used to block the implant from the bottom plate 204.

Still referring to FIG. 5C, a silicide layer 208 is formed over polysilicon layer 206. At the same time, the CMOS gate electrodes, emitter electrodes, and source/drain regions are typically silicided. As an example, silicide layer 208 may be formed by depositing a layer of titanium and reacting it with polysilicon layer 206, in a nitrogen containing ambient, to form titanium-silicide. Any remaining titanium or titanium-nitride are then removed.

Figure 5D:
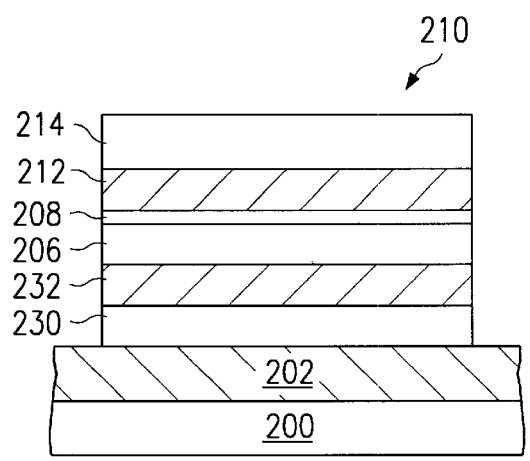

Capacitor dielectric 212 is then formed over bottom plate 204 as shown in FIG. 5D. Capacitor dielectric 212 may be formed by deposition of silicon dioxide. Other suitable capacitor dielectric, such as silicon-oxynitride, may alternatively be used. Capacitor dielectric 212 has a thickness on the order of 500 Å.

Finally, top plate 214 is formed over capacitor dielectric 212. Top plate 214 may have a thickness on the order of 2000 Å. Top plate 214 comprises a conductive metal such as TiN or tungsten.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

What is claimed is:

1. An integrated circuit, comprising a capacitor, wherein the capacitor comprises:
    a bottom plate comprising a first undoped polysilicon layer with an overlying silicide layer;
    a capacitor dielectric located over said bottom plate; and
    a top plate located over said capacitor dielectric.

2. The integrated circuit of claim 1, wherein said top plate comprises titanium-nitride.

3. The integrated circuit of claim 1, wherein said bottom plate is located on a field oxide.

4. The integrated circuit of claim 1, wherein said silicide layer comprises titanium-silicide.

5. The integrated circuit of claim 1 wherein said capacitor is an ac coupling capacitor.

6. A RF BiCMOS integrated circuit comprising a capacitor which comprises:
    a first undoped polysilicon layer;
    a silicide layer overlying said first undoped polysilicon layer;
    a capacitor dielectric located over said silicide layer; and
    a top plate located over said capacitor dielectric.

7. The integrated circuit of claim 6, wherein said top plate comprises titanium-nitride.

8. The integrated circuit of claim 6, wherein said first undoped polysilicon layer is located on a field oxide.

9. The integrated circuit of claim 6, wherein said first undoped polysilicon layer is separated from a second undoped polysilicon layer by a dielectric layer.

10. The integrated circuit of claim 6, wherein said suicide layer comprises titanium-silicide.

11. The integrated circuit of claim 6, wherein said capacitor is an ac coupling capacitor.

12. An integrated circuit, comprising a capacitor, wherein the capacitor comprises:
    a bottom plate comprising a first undoped polysilicon layer with an overlying silicide layer;
    a capacitor dielectric located over said bottom plate; and
    a top plate located over said capacitor dielectric;
    wherein said bottom plate is separated from a second undoped polysilicon layer by a dielectric layer.

* * * * *